(12) United States Patent  
Merklein et al.

(10) Patent No.: US 8,978,442 B2  
(45) Date of Patent: Mar. 17, 2015

(54) ELECTRIC INPUT KEY

(75) Inventors: Harald Merklein, Wettstetten (DE); Martin Bauer, Ingolstadt (DE)

(73) Assignee: Audi Ag, Ingolstadt (DE)

( * ) Notice: Subject to any disclaimer, the term of this patent is extended or adjusted under 35 U.S.C. 154(b) by 0 days.

(21) Appl. No.: 14/122,016

(22) PCT Filed: May 11, 2012

(86) PCT No.: PCT/EP2012/002025  
§ 371 (c)(1),  
(2), (4) Date: Nov. 25, 2013

(87) PCT Pub. No.: WO2012/159712  
PCT Pub. Date: Nov. 29, 2012

(65) Prior Publication Data  
US 2014/0083163 A1  Mar. 27, 2014

(30) Foreign Application Priority Data  
May 25, 2011  (DE) .......................... 10 2011 103 124

(51) Int. Cl.  
*G01R 35/00* (2006.01)  
*G01D 3/02* (2006.01)  
*G01D 3/08* (2006.01)

(52) U.S. Cl.  
CPC ................ *G01R 35/005* (2013.01); *G01D 3/02* (2013.01); *G01D 3/08* (2013.01)  
USPC ................ 73/1.79; 702/87; 702/88; 702/104; 700/6

(58) Field of Classification Search  
USPC ...................... 73/1.79; 700/6; 702/87, 88, 104  
See application file for complete search history.

(56) References Cited

U.S. PATENT DOCUMENTS

| | | |
|---|---|---|
| 5,180,955 A | 1/1993 | Karidis et al. |
| 5,573,236 A | 11/1996 | Petocchi et al. |
| 2004/0256877 A1 | 12/2004 | Tromblee et al. |
| 2008/0029376 A1 | 2/2008 | Ngoagouni |
| 2008/0048649 A1 | 2/2008 | Choi et al. |
| 2009/0210118 A1 | 8/2009 | Takamoto |

FOREIGN PATENT DOCUMENTS

| | | |
|---|---|---|
| DE | 10025662 | 12/2001 |
| DE | 102006030746 | 12/2007 |

(Continued)

OTHER PUBLICATIONS

WIPO English Language Translation of International Preliminary Report on Patentability for PCT/EP2012/002025, mailed Dec. 5, 2013, 7 pages.

(Continued)

*Primary Examiner* — Peter Macchiarolo  
*Assistant Examiner* — Alexander Mercado  
(74) *Attorney, Agent, or Firm* — Staas & Halsey LLP

(57) ABSTRACT

An electric input key has an actuating surface and a plurality of displacement sensors which are each designed to generate a displacement signal when the actuating surface is touched. The input key also has an evaluation unit for evaluating the displacement signals and outputting a determined switching state. The input key has at least one analog displacement sensor, at least one digital displacement sensor, and a calibration device for calibrating the analog displacement sensor by using displacement signals measured by the digital displacement sensor. The evaluation unit is designed to carry out self-diagnosis by using calibrated and measured displacement signals.

20 Claims, 2 Drawing Sheets

(56) References Cited

FOREIGN PATENT DOCUMENTS

| DE | 102008015910 | 10/2009 |
|----|--------------|---------|
| DE | 102011103124.7 | 5/2011 |
| JP | 2006-062480 | 3/2006 |
| WO | PCT/EP2012/002025 | 5/2012 |

OTHER PUBLICATIONS

English Language International Search Report for PCT/EP2012/002025, mailed Jun. 14, 2013, 3 pages.

ELECTRIC INPUT KEY

CROSS REFERENCE TO RELATED APPLICATIONS

This application is based on and hereby claims priority to International Application No. PCT/EP2012/002025 filed on May 11, 2012 and German Application No. 10 2011 103 124.7 filed on May 25, 2011, the contents of which are hereby incorporated by reference.

BACKGROUND

The invention relates to an electric input key having an actuating surface.

Such input keys are used, for example in motor vehicles, to input switching desires in shift-by-wire switching actuation systems. The displacement sensor system of the input key can be redundantly designed by using a plurality of digital sensors, for example microswitches.

DE 10 2008 015 910 A1 discloses an electric input key, the actuation of which causes a plurality of switches to switch at the same time. A possible malfunction can be determined using a diagnostic routine. For this purpose, a test signal is generated, which test signal is applied to one or more switches and is evaluated by a control unit.

Electric input keys having digital displacement sensors, in which three digital switches are used for example, are also known. A particular switching state or a state change is detected by the signal from two of the three digital switches, with the result that the malfunction of an individual digital switch has no effects. However, such conventional electric input keys having a plurality of redundant digital displacement sensors also have disadvantages. On account of unavoidable mechanical tolerances, the displacement sensors installed in an input key or a switching input unit have different switching points. If the input key or another input element is actuated only to the extent that not all displacement sensors switch, the displacement sensor which has not yet switched is incorrectly diagnosed as defective. Over the service life, wear of the mechanical components may result in shifts of the switching points of the displacement sensors, which shifts may result in an increase in the switching point differences between the individual sensors. This may result in an increase in the above-described false diagnoses of individual displacement sensors.

SUMMARY

Therefore, one possible object is specifying an electric input key which can be diagnosed using a redundant displacement sensor system and is largely insensitive to mechanical tolerances and shifts of switching points.

The inventors propose an electric input key having an actuating surface and a plurality of displacement sensors, which are each designed to generate a displacement signal when the actuating surface is touched, as well as an evaluation unit for evaluating the displacement signals and for outputting a determined switching state. Specifically, the proposed key comprises at least one analog displacement sensor and at least one digital displacement sensor as well as a calibration device for calibrating the analog displacement sensor using recorded displacement signals from the digital displacement sensor, the evaluation unit being designed to carry out a self-diagnosis using calibrated and recorded displacement signals. Alternatively, the analog displacement sensor may also be calibrated using recorded displacement signals from a further analog displacement sensor. Such an input key has at least two analog displacement sensors.

The proposed key is based on the knowledge that a particularly reliable redundant electric input key can be obtained if the input key comprises at least one analog displacement sensor and at least one further displacement sensor. A calibration device is used to calibrate the analog displacement sensor on the basis of recorded displacement signals from the further displacement sensor which may be a digital displacement sensor or a further analog displacement sensor. The evaluation unit is designed to carry out a self-diagnosis during which calibrated displacement signals and current, recorded displacement signals are compared with one another in order to detect a particular switching state. Deviations and possibly malfunctions may be determined by comparing the calibrated displacement signals with the recorded displacement signals.

Within the scope of the proposal, provision may be made for a digital displacement sensor of the electric input key to be in the form of a microswitch or a digital Hall sensor or a digital magnetoresistive sensor. Digital displacement sensors in the form of microswitches have the advantage that they are cost-effective and can generate an acoustically perceptible signal during switching.

In the proposed electric input key, the at least one analog displacement sensor may be in the form of an inductive sensor or a capacitive sensor or an analog Hall sensor or an analog magnetoresistive sensor. Analog displacement sensors have the advantage that they provide an analog displacement signal for each point along their actuating travel. The electric input key comprises at least one analog displacement sensor, which is calibrated, and at least one further displacement sensor which may be in the form of a digital or analog displacement sensor.

The displacement signal may preferably be a voltage, but the displacement signal may alternatively also be a current, a capacitance or a magnetic field strength.

One development provides for the calibration device of the electric input key to be designed to calibrate the analog displacement sensor when the actuating surface is touched for the first time and/or after a stipulated number of switching operations. The analog displacement sensor is preferably calibrated or self-calibrated when the input key is actuated for the first time. For this purpose, the first manual actuating operations or a particular number of actuating operations may be recorded and evaluated. A calibration is carried out using these recorded measured values of the analog displacement sensor, with the result that displacement signals from the digital displacement sensor can be monitored and used as a basis for calibration.

It is also within the scope of the proposals that, in order to calibrate the analog displacement sensor, limit values are stipulated for the displacement signals, in particular the voltages, during switch-on and switch-off, the evaluation unit being able to output a fault signal if said limit values are exceeded or undershot. These limit values have the function of a "calibration limit", with the result that calibration values can be stipulated only in a stipulated range of values of the analog displacement sensor. If the evaluation unit outputs a fault signal, the latter can be transmitted to an evaluation unit or to another device via a data output and/or a diagnostic output.

According to one development, the calibration device of the electric input key may be designed to calibrate the analog displacement sensor using a statistical evaluation of switching operations. Such a statistical evaluation can be carried out during operation, in which case differences between the switching points of the analog displacement sensor and of the further analog displacement sensor or of a digital displacement sensor can be detected. If a drift in the switching points has been detected, the calibration values of the analog displacement sensor can be accordingly adapted.

Within the scope, provision may also be made for the calibration of the analog displacement sensor to comprise the stipulation of ranges of values for the displacement signals, in particular the voltages, during switch-on and switch-off using calibrated displacement signals from the digital displacement sensor. During calibration, voltages, for example, are first of all recorded as displacement signals from the digital displacement sensor and ranges of values for the displacement signals or voltages of the analog displacement sensor during switch-on and switch-off are stipulated on this basis. If the voltage of the analog displacement sensor is outside the ranges of values in the electric input key, the evaluation unit can output a fault signal.

The inventors also propose a motor vehicle. The motor vehicle is distinguished by the fact that it has at least one electric input key of the described type.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
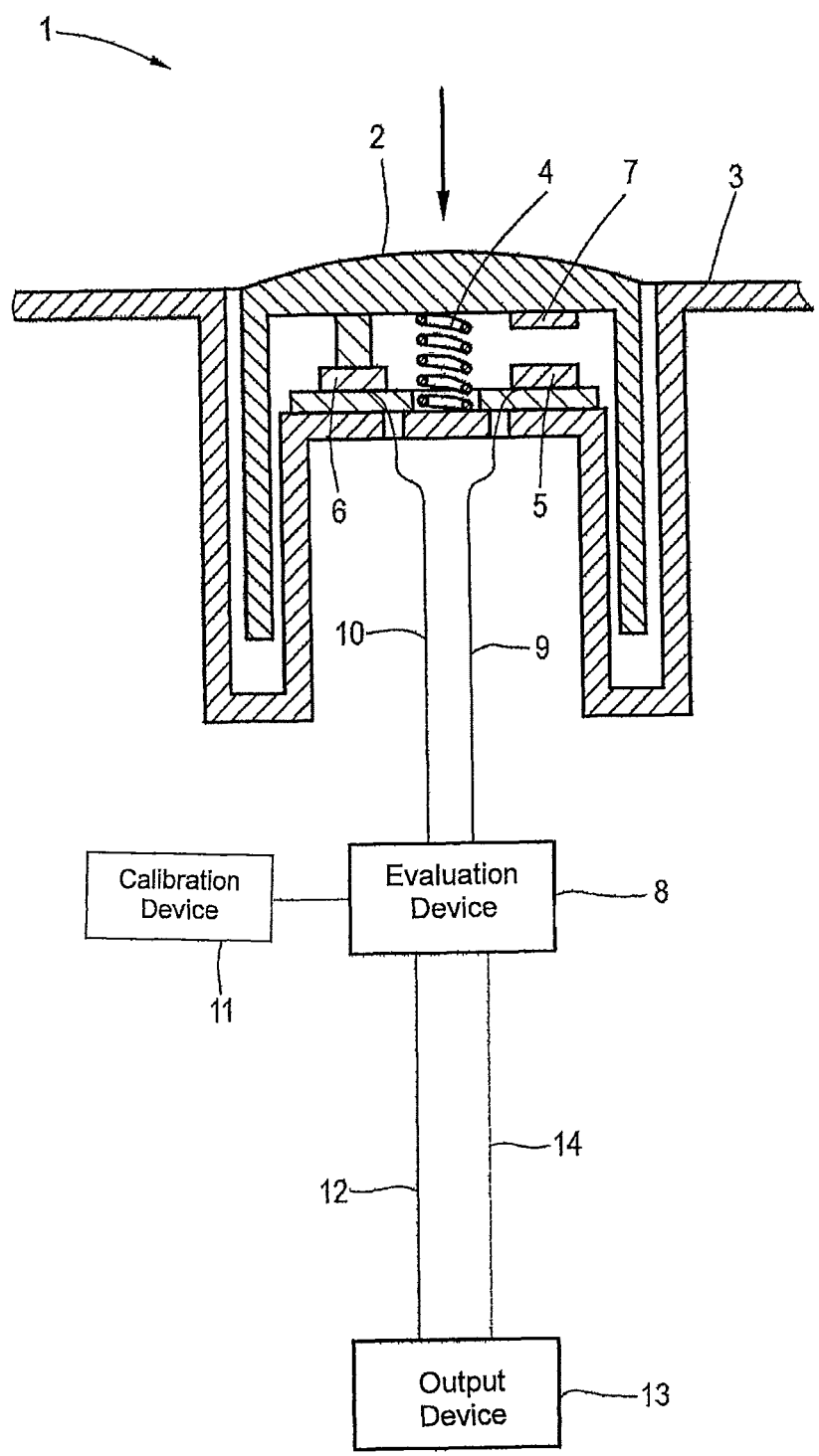
FIG. 1 shows a sectional view of an electric input key according to one potential embodiment of the proposals.

Reference will now be made in detail to the preferred embodiments of the present invention, examples of which are illustrated in the accompanying drawings, wherein like reference numerals refer to like elements throughout.

The electric input key 1 schematically illustrated in a sectional view in FIG. 1 comprises an actuating surface 2 which is mounted in a resilient manner in a base body 3. When the actuating surface 2 is pressed down, a spiral spring 4 is compressed and the actuating surface 2 automatically returns to its starting position after the spiral spring 4 is released.

The input key 1 also comprises an analog displacement sensor 5 and a digital displacement sensor 6. Other exemplary embodiments are also possible in which two analog displacement sensors or more than two displacement sensors are used. In principle, the input key comprises at least one analog displacement sensor and at least one further displacement sensor (analog or digital).

In the exemplary embodiment illustrated, the analog displacement sensor 5 is an inductive sensor which interacts with a magnet 7. When the actuating surface 2 is shifted, the magnet 7 approaches the analog displacement sensor 5, as a result of which a voltage is generated as a displacement signal. This voltage is supplied to an evaluation unit 8. In the same manner, the digital displacement sensor 6 generates a voltage as a displacement signal when the actuating surface 2 is shifted, which voltage is likewise supplied to the evaluation unit 8. The evaluation unit 8 is connected, via a line, to a calibration device 11 which is used for calibration.

The evaluation unit 8 is connected, via an output signal line 12, to a device 13 which can undertake different tasks. These include the storage of fault data, the forwarding of the evaluated displacement signals to other devices or reprogramming of the evaluation unit 8; a diagnostic and programming signal line 14 is additionally provided for this purpose and connects the evaluation unit 8 to the device 13. However, the line 14 may also be integrated in the output signal line 12.

The analog displacement sensor 5 and the digital displacement sensor 6 of the electric input key 1 are arranged between the underside of the actuating surface 2 and a supporting surface of the base body 3 in such a manner that their measuring path changes substantially in synchronism with the actuation of the actuating surface 2. The evaluation unit 8 diagnoses the two voltage signals generated by the displacement sensors 5, 6 and outputs the determined switching state of the input key 1 via the output signal line 12. When the electric input key 1 is actuated for the first time, the analog displacement sensor 5 is first of all calibrated. During the first actuation, those measured values of the analog displacement sensor 5 which correspond to the switching points of the digital displacement sensor 6 are determined.

Figure 2:
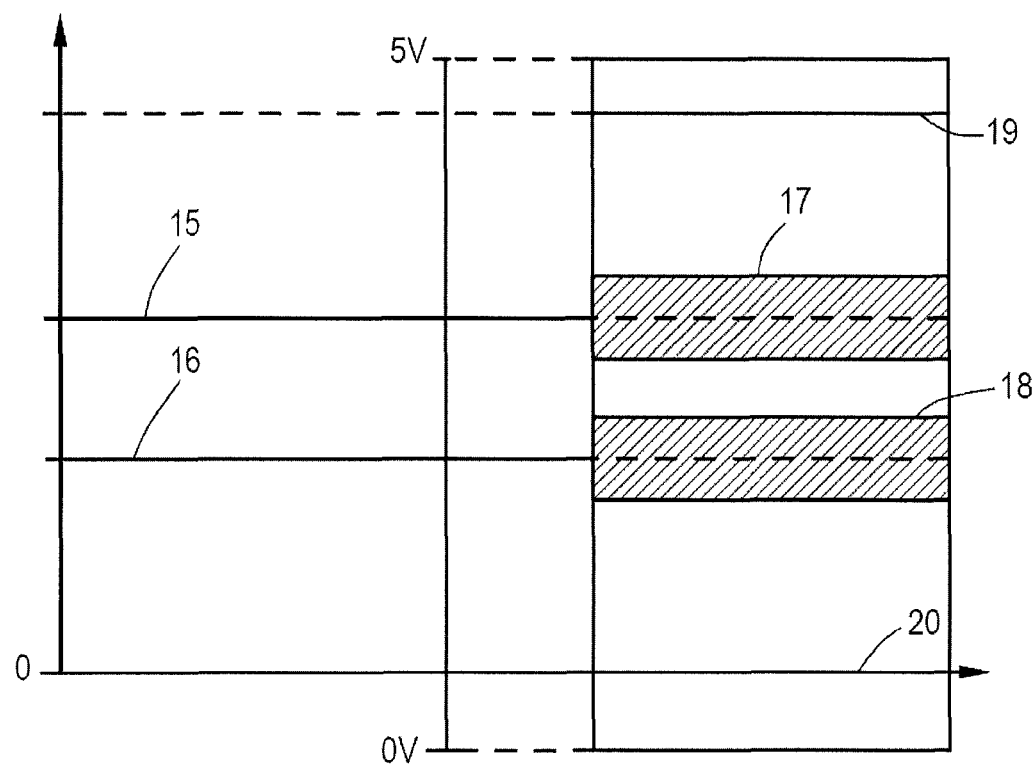
FIG. 2 shows a graph in which voltages as displacement signals for an analog displacement sensor and for a digital displacement sensor are plotted.

In the graph in FIG. 2, the line 15 denotes the calibrated switching-on point of the digital displacement sensor 6. The line 16 denotes the calibrated switching-off point of the digital displacement sensor 6. The switching-on point and the switching-off point of the digital displacement sensor 6 correspond to particular voltages. The analog displacement sensor 5 is calibrated according to the switching-on point and the switching-off point of the digital displacement sensor 6. A reliable range of measured values 17 is formed around the switching-on point for the analog displacement sensor 5. This range of values which is limited by a lower voltage and an upper voltage corresponds to a tolerance range for reliable switching operations in which the input key 1 is switched on. In a similar manner, a reliable range of measured values 18 is defined around the calibrated switching-off point, which range of values defines reliable voltage values when switching off the electric input key 1. No switching operation can take place in the voltage range between the ranges of values 17, 18.

If the voltage of the analog displacement sensor 5 exceeds an upper limit 19, this is interpreted as a fault of the analog sensor. The same analogously applies if a lower limit 20 is undershot.

After the calibration carried out at the start, the evaluation unit 8 compares the voltage signals from the analog displacement sensor and from the digital displacement sensor during further operation. If the measured values of the two sensor systems do not match or if there are excessive differences between the measured values of the two sensor systems or in the case of implausible measured values of the analog displacement sensor, fault messages are output.

The electric input key 1 shown in FIG. 1 is designed in such a manner that a self-calibration is also carried out during operation. For this purpose, the difference between the switching points of the analog displacement sensor 5 and of the digital displacement sensor 6 is statistically evaluated. If a drift in the switching points results over the service life, a new calibration is carried out in order to match the switching points of the digital displacement sensor 6 to those of the analog displacement sensor 5.

The signal values provided by the two sensors are monitored and diagnosed continuously; if a fault is detected during diagnosis, the following data items can be output via the output signal line 12 or the diagnostic and programming line 14: the current calibration values, that is to say the voltages corresponding to the switching-on and switching-off points, the switching points of the digital sensor system which are determined using the analog sensor system and the determined deviation of the switching points of the digital sensor system from the calibration values of the analog sensor system.

The electric input key comprises a diagnostic and/or calibration mode in which all current measured values and calibration values are output and in which a targeted recalibration can be carried out.

The important system components of the input key, namely the actuating surface, the analog displacement sensor and the digital displacement sensor, as well as the evaluation unit and the calibration unit need not necessarily be designed separately; a plurality of system components may be combined to form subassemblies.

The proposal is not restricted to the exemplary embodiment illustrated; embodiments in which two analog displacement sensors are provided are also possible, in particular. An analog displacement sensor is used to stipulate the switching points and these switching points are used to calibrate the other analog displacement sensor.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

The invention claimed is:

1. An electric input key comprising:
an actuating surface;
an analog displacement sensor to generate at least one first displacement signal when the actuating surface is actuated;
a digital displacement sensor to generate at least one second displacement signal when the actuating surface is actuated;
a calibration device to calibrate the analog displacement sensor using second displacement signals that have been recorded; and
an evaluation unit to evaluate the at least one first and second displacement signals, to output a determined switching state, and to carry out a self-diagnosis using calibrated and recorded displacement signals,
wherein
the at least one second displacement signal comprises a digital on signal corresponding to a switching-on point and a digital off signal corresponding to a switching-off point, and
the calibration device calibrates the analog displacement sensor according to a first tolerance range of values around the switching-on point and a second tolerance range of values around the switching-off point.

2. The electric input key as claimed in claim 1, wherein the digital displacement sensor is selected from the group consisting of a microswitch, a digital Hall sensor and a digital magnetoresistive sensor.

3. The electric input key as claimed in claim 1, wherein the analog displacement sensor is selected from the group consisting of an inductive sensor, a capacitive sensor, an analog Hall sensor and an analog magnetoresistive sensor.

4. The electric input key as claimed in claim 1, wherein the calibration device calibrates the analog displacement sensor when the actuating surface is actuated for a first time.

5. The electric input key as claimed in claim 1, wherein the calibration device calibrates the analog displacement sensor after the electric input key has been switched on and off a predetermined number of times.

6. The electric input key as claimed in claim 1, wherein
the analog displacement sensor produces the at least one first displacement signal during switch-on and switch-off, respectively,
in order to calibrate the analog displacement sensor, upper and lower limit values are stipulated for the at least one first displacement signal, and
the evaluation unit outputs a fault signal if the upper limit value is exceeded or the lower limit is undershot.

7. The electric input key as claimed in claim 1, wherein
in order to calibrate the analog displacement sensor, upper and lower limit values are stipulated for the at least one first displacement signal, and
as part of the self-diagnosis, the evaluation unit outputs a fault signal if the upper limit value is exceeded or the lower limit is undershot.

8. The electric input key as claimed in claim 1, wherein the calibration device calibrates the analog displacement sensor using a statistical evaluation of a difference between switching points of the analog displacement sensor and the digital displacement sensor over time.

9. The electric input key as claimed in claim 1, wherein
the at least one first displacement signal comprises an analog on signal and an analog off signal.

10. The electric input key as claimed in claim 9, wherein
the calibration device calibrates the analog displacement sensor by matching the analog on and analog off signals to fall within the first tolerance range of values around the switching-on point and the second tolerance range of values around the switching-off point.

11. The electric input key as claimed in claim 9, wherein the evaluation unit outputs a fault signal when the analog on or analog off signal is outside the respective stipulated range of values.

12. The electric input key as claimed in claim 1, wherein
the evaluation unit outputs a fault signal as part of the self-diagnosis, and
the fault signal triggers the calibration unit to calibrate the at least one displacement signal.

13. The electric input key as claimed in claim 1, wherein
the at least one first and second displacement signals are voltages, and
calibration comprises assigning an acceptable voltage range to the at least one first displacement signal, based on the voltage of the second displacement sensor.

14. The electric input key as claimed in claim 1, wherein the at least one first and second displacement signals are selected from the group consisting of voltage signals, current signals, capacitance signals and magnetic field strength signals.

15. The electric input key according to claim 1, wherein the electric input key comprises the analog displacement sensor, the digital displacement sensor and at least one other displacement sensor.

16. The electric input key according to claim 1, wherein
the actuating surface is spring biased toward a casing of the electric input key, and
the analog and digital displacement sensors are provided substantially in parallel under the actuating surface such that the at least one first and second displacement signals are generated substantially at the same time.

17. The electric input key according to claim 1, wherein the evaluation unit outputs a switch signal when the at least one first and second displacement signals are generated substantially at the same time.

18. A motor vehicle, comprising:
an electric input key comprising:
an actuating surface;
an analog displacement sensor to generate at least one first displacement signal when the actuating surface is actuated;
a digital displacement sensor to generate at least one second displacement signal when the actuating surface is actuated;
a calibration device to calibrate the analog displacement sensor using second displacement signals that have been recorded; and
an evaluation unit to evaluate the at least one first and second displacement signals, to output a determined switching state, and to carry out a self-diagnosis using calibrated and recorded displacement signals,
wherein
the at least one second displacement signal comprises a digital on signal corresponding to a switching-on point and a digital off signal corresponding to a switching-off point, and
the calibration device calibrates the analog displacement sensor according to a first tolerance range of values around the switching-on point and a second tolerance range of values around the switching-off point.

19. The electric input key according to claim 1, wherein the actuating surface is actuated when the actuating surface is touched, causing the actuating surface to move.

20. The electric input key according to claim 1, wherein the evaluation unit determines a first switching operation in which the electric input key is switched on when the at least one first and second displacement signals correspond to the first tolerance range of values, the evaluation unit determines a second switching operation in which the electric input key is switched off when the at least one first and second displacement signals correspond to the second tolerance range of values, and the evaluation unit determines no switching operation has occurred when the at least one first and second displacement signals correspond to a range of values between the first tolerance range of values and the second tolerance range of values.

* * * * *

UNITED STATES PATENT AND TRADEMARK OFFICE
CERTIFICATE OF CORRECTION

PATENT NO. : 8,978,442 B2  
APPLICATION NO. : 14/122016  
DATED : March 17, 2015  
INVENTOR(S) : Harald Merklein et al.

Page 1 of 1

It is certified that error appears in the above-identified patent and that said Letters Patent is hereby corrected as shown below:

In the Claims

Column 6, Line 34, In Claim 10, delete "point." and insert -- point, respectively. --.
Column 6, Line 43, In Claim 12, after "one" insert -- first --.

Signed and Sealed this
Twenty-first Day of July, 2015

Michelle K. Lee
*Director of the United States Patent and Trademark Office*